(12) United States Patent
Hashimoto et al.

(10) Patent No.: US 7,687,885 B2
(45) Date of Patent: Mar. 30, 2010

(54) SEMICONDUCTOR DEVICE WITH REDUCED PARASITIC INDUCTANCE

(75) Inventors: Takayuki Hashimoto, Tokai (JP);
Noboru Akiyama, Hitachinaka (JP);
Masaki Shiraishi, Hitachinaka (JP);
Tetsuya Kawashima, Hitachi (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/809,023

(22) Filed: May 30, 2007

(65) Prior Publication Data
US 2007/0278516 A1   Dec. 6, 2007

(30) Foreign Application Priority Data
May 30, 2006   (JP) .............................. 2006-149489

(51) Int. Cl.
*H01L 31/111* (2006.01)
*G05F 1/10* (2006.01)
*H02J 3/12* (2006.01)
*H01L 25/04* (2006.01)
*H01L 25/18* (2006.01)
*G06F 1/26* (2006.01)
*H02M 3/155* (2006.01)

(52) U.S. Cl. .............................. 257/532; 257/E23.085; 257/E25.029; 257/177; 257/528; 257/535; 257/685; 257/686; 257/723; 257/786; 257/784; 257/678; 323/234

(58) Field of Classification Search ................... 257/177, 257/E23.085, 686, 685, 723, 528, 732, 535, 257/E25.029, 784, 786; 323/234
See application file for complete search history.

(56) References Cited

U.S. PATENT DOCUMENTS

| 2006/0006432 | A1* | 1/2006  | Shiraishi et al. | 257/288 |
| 2007/0145580 | A1* | 6/2007  | Satou et al.     | 257/723 |
| 2007/0228534 | A1* | 10/2007 | Uno et al.       | 257/678 |
| 2007/0257708 | A1* | 11/2007 | Shimokawa et al. | 327/5   |

FOREIGN PATENT DOCUMENTS

| JP | 2002-217416 | 8/2002 |
| JP | 2003-528449 | 9/2003 |

* cited by examiner

*Primary Examiner*—Alexander O Williams
(74) *Attorney, Agent, or Firm*—Townsend and Townsend and Crew LLP

(57) ABSTRACT

The present invention provides a technology for reducing the parasitic inductance of the main circuit of a power source unit. In a non-insulated DC-DC converter having a circuit in which a power MOSFET for high side switch and a power MOSFET for low side switch are connected in series, the power MOSFET for high side switch and the power MOSFET for low side switch are formed of n-channel vertical MOSFETS, and a source electrode of the power MOSFET for high side switch and a drain electrode of the power MOSFET for low side switch are electrically connected via the same die pad.

2 Claims, 8 Drawing Sheets

SEMICONDUCTOR DEVICE WITH REDUCED PARASITIC INDUCTANCE

CROSS-REFERENCE TO RELATED APPLICATION

The present application claims priority from Japanese Patent Application No. JP 2006-149489 filed on May 30, 2006, the content of which is hereby incorporated by reference into this application.

TECHNICAL FIELD OF THE INVENTION

The present invention relates to a technology for a semiconductor device. More particularly, it relates to a technology effectively applied to a semiconductor device having a power source circuit.

BACKGROUND OF THE INVENTION

In a DC-DC converter widely used as an example of a power source circuit, a power MOSFET (Metal Oxide Semiconductor Field Effect Transistor) for a high side and a power MOSFET for a low side are connected in series. The power MOSFET for high side has a switch function for control of the DC-DC converter, and the MOSFET for low side has a switch function for synchronous rectification. These two power MOSFETs are alternately turned ON/OFF in synchronization, thereby converting power source voltage.

Such a DC-DC converter is described, for example, in Japanese Unexamined Patent Application Publication (Tokuhyo) No. 2003-528449 (Patent Document 1), and it discloses a structure in which a power MOSFET for high side, a power MOSFET for low side, a driver circuit which drives these power MOSFETs, and an input capacitor are contained in the same package.

Further, Japanese Patent Application Laid-Open Publication No. 2002-217416 (Patent Document 2) discloses a package structure in which a power MOSFET for high side constituting a DC-DC converter is formed of a horizontal power MOSFET, a power MOSFET for low side is formed of a vertical power MOSFET, and these power MOSFETs are mounted on a common frame.

SUMMARY OF THE INVENTION

Meanwhile, the current and frequency of a non-insulated DC-DC converter used for a power source circuit of a desktop personal computer, a server, a game machine and others have been increased along with the increasing demands for the current increase in CPU (Central Processing Unit) to be driven and the size reduction of passive components such as a choke coil and an input/output capacitor.

However, under the large current and high frequency conditions, there occurs a problem that losses increase due to a main circuit inductance that parasitizes in the main circuit around an input capacitor of a non-insulated DC-DC converter. In particular, when the main circuit inductance that parasitizes in the main circuit around the input capacitor becomes large along with the current increase and frequency increase, the jump voltage at the turn-off of the power MOSFET for high side of the DC-DC converter increases, and as a result, the switching losses are increased, and large losses are caused.

In order to reduce the main circuit inductance described above, a structure in which a semiconductor chip on which a power MOSFET for high side is formed and a semiconductor chip on which a power MOSFET for low side is formed are contained in the same package is used. Further, a structure in which a semiconductor chip on which a power MOSFET for high side is formed, a semiconductor chip on which a power MOSFET for low side is formed, and a semiconductor chip on which a driver circuit is formed are contained in the same package is also used. In both cases, the respective semiconductor chips are mounted on respectively different die pads, and the source of the power MOSFET for high side is electrically connected via a bonding wire to the die pad on which the semiconductor chip on which the power MOSFET for low side is formed is mounted. However, in these structures, since the input capacitor is externally disposed, it is not possible to sufficiently reduce the parasitic inductance. Further, since the source of the power MOSFET for high side and the die pads and the source of the power MOSFET for low side and the reference potential are electrically connected by bonding wires, respectively, the reduction of the parasitic inductance is limited.

Further, the Patent Document 2 discloses a structure in which a semiconductor chip on which a power MOSFET for high side is formed, a semiconductor chip on which a power MOSFET for low side is formed, a semiconductor chip on which a driver circuit is formed, and an input capacitor Cin are contained in the same package. In this case, the source of the power MOSFET for high side is electrically connected to a wiring of a wiring board via a bonding wire, and the wiring is electrically connected to the drain of the power MOSFET for low side. The source of the power MOSFET for low side is electrically connected via a bonding wire to the output wiring of the wiring board. However, even in such a structure, it is not possible to sufficiently reduce the parasitic inductance because connections are made by bonding wires, and furthermore, the reduction of the parasitic inductance is limited because there is a certain distance between the input capacitor and the respective power MOSFETs.

Accordingly, an object of the present invention is to provide a technology capable of reducing the parasitic inductance of the main circuit of a power source circuit.

The above and other objects and novel characteristics of the present invention will be apparent from the description of this specification and the accompanying drawings.

The typical ones of the inventions disclosed in this application will be briefly described as follows.

That is, according to the present invention, a field effect transistor of a first semiconductor chip is formed of an n-channel vertical field effect transistor, a field effect transistor of a second semiconductor chip is formed of an n-channel vertical field effect transistor, a surface on which a source electrode of the first semiconductor chip is disposed and a surface on which a drain electrode of the second semiconductor chip is disposed are mounted on the same chip mounting portion and electrically connected to each other, a drain electrode of the first semiconductor chip has a first lead plate connected to an external terminal for supplying input power, and a source electrode of the second semiconductor chip has a second lead plate connected to an external terminal for supplying reference potential.

Further, according to the present invention, a field effect transistor of a first semiconductor chip is formed of an n-channel vertical field effect transistor, a field effect transistor of a second semiconductor chip is formed of an n-channel vertical field effect transistor, a surface on which a source electrode of the first semiconductor chip is disposed and a surface on which a drain electrode of the second semiconductor chip is disposed are mounted on the same chip mounting portion and electrically connected to each other, a drain electrode of the first semiconductor chip has a first lead plate connected to an external terminal for supplying input power, and a source electrode of the second semiconductor chip has a second lead plate connected to an external terminal for supplying reference potential, wherein a capacitor electrically connected between the first lead plate and the second lead plate is provided, and in the capacitor, one of a pair of electrodes is connected to the first lead plate and the other of the pair of electrodes is connected to the second lead plate.

The effects obtained by typical aspects of the present invention will be briefly described below.

That is, according to the present invention, a field effect transistor of a first semiconductor chip is formed of an n-channel vertical field effect transistor, a field effect transistor of a second semiconductor chip is formed of an n-channel vertical field effect transistor, a surface on which a source electrode of the first semiconductor chip is disposed and a surface on which a drain electrode of the second semiconductor chip is disposed are mounted on the same chip mounting portion and electrically connected to each other, a drain electrode of the first semiconductor chip has a first lead plate connected to an external terminal for supplying input power, and a source electrode of the second semiconductor chip has a second lead plate connected to an external terminal for supplying reference potential. By this means, since it is possible to reduce inductance in the wiring between the first and second semiconductor chips, it is possible to reduce the parasitic inductance of the main circuit of a power source circuit.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above. Also, components having the same function are denoted by the same reference symbols throughout the drawings for describing the embodiments, and the repetitive description thereof is omitted. The embodiments of the present invention will be described below in detail with reference to the drawings.

First Embodiment

A semiconductor device according to the first embodiment of the present invention is a non-insulated DC-DC converter used for a power source circuit of, for example, a desktop personal computer, a notebook personal computer, a server, a game machine and others.

Figure 1:
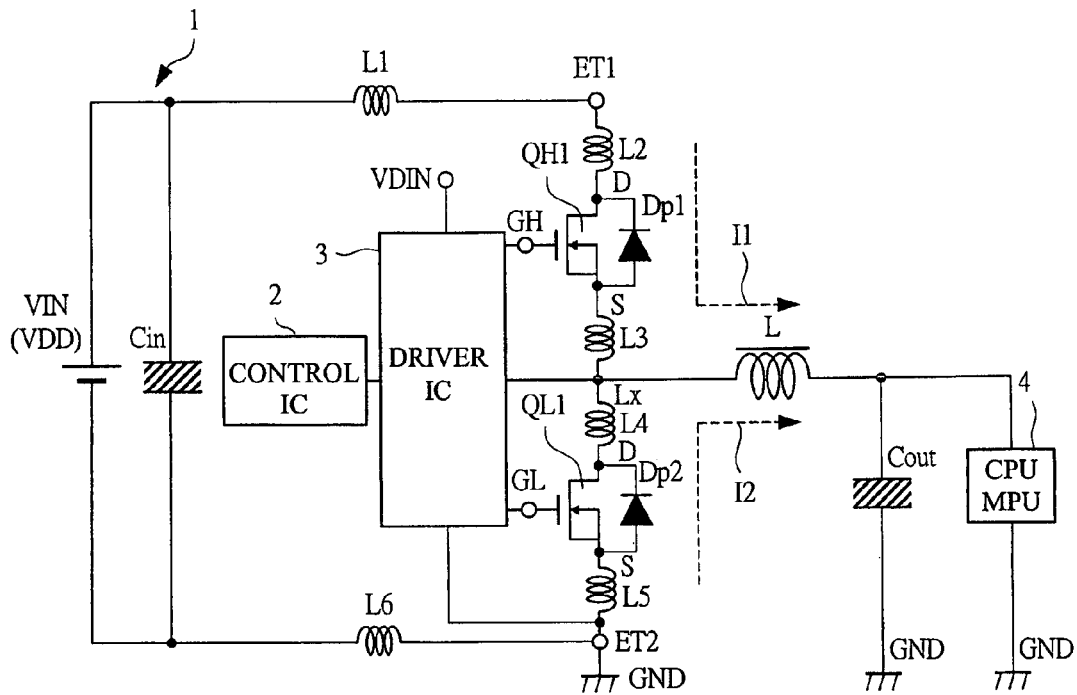
FIG. 1 is a circuit diagram of a semiconductor device according to an embodiment of the present invention.

FIG. 1 shows the circuit diagram of an example of a non-insulated DC-DC converter 1 examined by the inventors of the present invention. The non-insulated DC-DC converter 1 has such elements as a control circuit 2, a driver circuit 3, power MOSFETs (hereinafter, referred to simply as power MOS) QH1 and QL1, an input capacitor Cin, an output capacitor Cout, and a coil L. Meanwhile, D denotes a drain and S denotes a source. Further, L1 to L6 denote parasitic inductances that parasitize in the main circuit of the non-insulated DC-DC converter.

The control circuit 2 is a circuit that supplies the signal to control the width of voltage switch on (ON time) of the power MOSs QH1 and QL1 such as a pulse width modulation (PWM) circuit. The output of the control circuit 2 (terminal for control signals) is electrically connected to the input of the driver circuit 3. The output of the driver circuit (first control circuit) 3 is electrically connected to the gate terminal GH of the power MOS QH1 and the gate terminal GL of the power MOS QL1. According to the control signal supplied from the control circuit 2, the driver circuit 3 controls the potentials of the gate terminals GH and GL of the respective power MOSs QH1 and QL1, thereby controlling the operations of the power MOSs QH1 and QL1. Meanwhile, VDIN denotes the input power of the driver circuit 3.

The power MOSs QH1 and QL1 are connected in series between a terminal (first power source terminal) ET1 for supplying high potential (first power source potential) VDD of the input power source VIN and a terminal (second power source terminal) ET2 for supplying reference potential (second power source potential) GND. That is, the power MOS QH1 is disposed so that the source and drain paths thereof are connected in series between the terminal ET1 for supplying high potential VDD of the input power source VIN and the output node (output terminal) Lx, and the power MOS QL1 is disposed so that the source and drain paths thereof are connected in series between the output node Lx and the terminal ET2 for supplying ground potential GND. Meanwhile, Dp1 denotes a parasitic diode (internal diode) of the power MOS QH1, and Dp2 denotes a parasitic diode (internal diode) of the power MOS QL1.

The power MOS QH1 is a power transistor for high side switch (high potential side: first operation voltage; hereinafter, referred to simply as high side) and has a switch function to store energy in the coil L that supplies electric power to the output of the non-insulated DC-DC converter 1 (input of the load circuit 4). This power MOSFET QH1 is formed of an n-channel vertical field effect transistor. The vertical field effect transistor is an element whose channel is formed in a thickness direction of the semiconductor chip, and it can increase the channel width per unit area more than the horizontal field effect transistor and can reduce ON-resistance. Therefore, it is possible to realize the size reduction of the element and the reduction of the package size.

Figure 2:
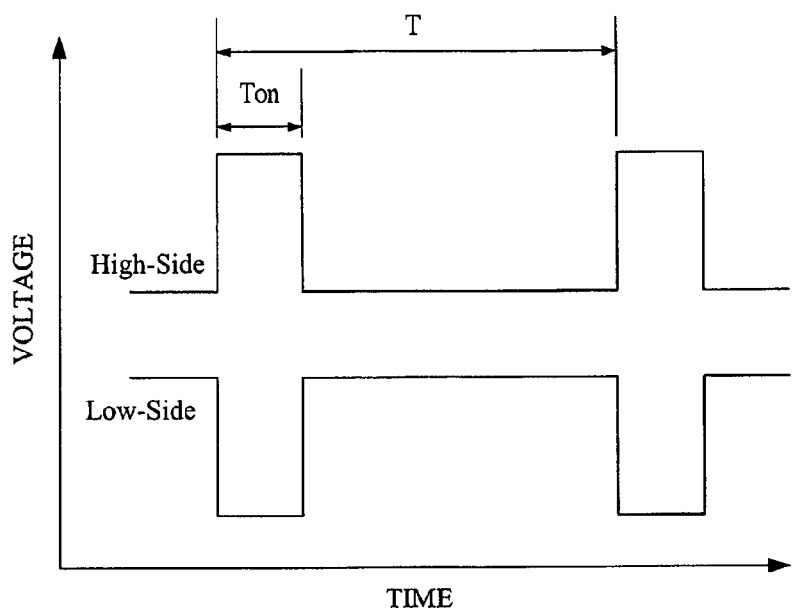
FIG. 2 is a timing chart of the semiconductor device in FIG. 1.

On the other hand, the power MOS (second field effect transistor) QL1 is a power transistor for low side switch (low potential side: second operation voltage; hereinafter, referred to simply as low side), and it is a transistor for rectification of the non-insulated DC-DC converter 1 and has a function to perform rectification by lowering the resistance of the transistor in synchronization with the frequency from the control circuit 2. Similar to the power MOS QH1, this power MOS QL1 is formed of an n-channel vertical power MOS. The reason why the vertical type is used is as follows. That is, as shown in the timing chart of the non-insulated DC-DC converter 1 of FIG. 2, the power MOS QL1 for low side has a longer ON time (time of applying voltage) than the ON time of the power MOS QH1 for high side, and losses by ON resistance appears larger than switching loss. Accordingly, it is advantageous to use the vertical field effect transistor that can increase the channel width per unit area more than the horizontal field effect transistor. In other words, by forming the power MOS QL1 for low side by the vertical field effect transistor, the ON resistance can be lowered, and thus, it is possible to improve the voltage conversion efficiency even if the current flowing in the non-insulated DC-DC converter 1 increases. Meanwhile, in FIG. 2, Ton denotes the pulse width at ON time of the power MOS QH1 for high side, and T denotes the pulse period.

The input capacitor Cin is electrically connected to the input power source VIN in FIG. 1 in parallel. This input capacitor Cin is a power source circuit that temporarily stores the energy (electric charge) supplied from the input power source VIN and supplies the stored energy to the main circuit of the non-insulated DC-DC converter 1. In this case, since the input power source VIN is the power source for not only the non-insulated DC-DC converter 1 but also other devices, it is disposed at a position away from the non-insulated DC-DC converter 1, and since the power supply efficiency decreases if power is supplied from the input power source VIN directly to the non-insulated DC-DC converter 1, power is supplied to the input capacitor Cin disposed at a relatively close position to the main circuit of the non-insulated DC-DC converter 1, and then the power is supplied therefrom to the main circuit of the non-insulated DC-DC converter 1. The input power source potential VDD of the input power source VIN is, for example, around 5 to 12 V. Further, the reference potential GND is, for example, lower than the input power source potential and is, for example, ground potential 0 V. Furthermore, the operation frequency of the non-insulated DC-DC converter 1 (period to turn ON and OFF the power MOSs QH1 and QL1) is, for example, 1 MHz.

On the wiring that connects the source of the power MOS QH1 and the drain of the power MOS QL1 of the non-insulated DC-DC converter 1, the output node Lx that supplies the output power source potential to the outside is disposed. The output node Lx is electrically connected via the output wiring to the coil L, and further electrically connected via the output wiring to the load circuit 4. A Schottky barrier diode (hereinafter, referred to as SBD) may be electrically connected between the output wiring that connects this output node Lx and the coil L and the terminal for supplying the reference potential GND so as to be in parallel to the above-mentioned power MOS QL1. The SBD is a diode whose forward voltage Vf is lower than that of the parasitic diode Dp2 of the power MOS QL1. In this SBD, the anode thereof is electrically connected to the terminal ET2 for supplying the reference potential GND, and the cathode thereof is electrically connected to the output wiring that connects the output node Lx and the drain of the power MOS QL1. By connecting the SBD in the above-described manner, the voltage drop in dead time when the power MOS QL1 is turned off can be decreased, and thus, the conductivity loss of the diode can be reduced. Further, it is possible to reduce the diode recovery loss because of the reduction in the reverse recovery time (trr).

The output capacitor Cout is electrically connected between the output wiring that connects the coil L and the load circuit 4 and the terminal for supplying the reference potential GND. Further, as the load circuit 4, a central processing unit (CPU) or a micro processing unit (MPU) of the above-mentioned electronic device and the like can be exemplified. Iout denotes output current and Vout denotes output voltage.

In the circuit described above, the power MOSs QH1 and QL1 are alternately turned ON/OFF in synchronization, thereby converting the power source voltage. That is, when the power MOS QH1 for high side switch is ON, current (first current) I1 flows from the terminal ET1 electrically connected to the drain D of the power MOS QH1 via the power MOS QH1 to the output node Lx, and when the power MOS QH1 for high side switch is OFF, current I2 flows by the back electromotive voltage of the coil L. By turning on the power MOS QL1 for low side switch when this current I2 is flowing, the voltage drop can be reduced. The current I1 is large current of, for example, about 20 A.

Meanwhile, in such a non-insulated DC-DC converter 1, along with the increase in current and frequency, the parasitic inductances (L1+L2+L3+L4+L5+L6) that parasitize in the main circuit around the input capacitor Cin become large, and the jump voltage particularly at the time of turn-off of the power MOS QH1 for high side of the non-insulated DC-DC converter 1 increases. As a result, the switching loss increases and large losses are caused.

Figure 3:
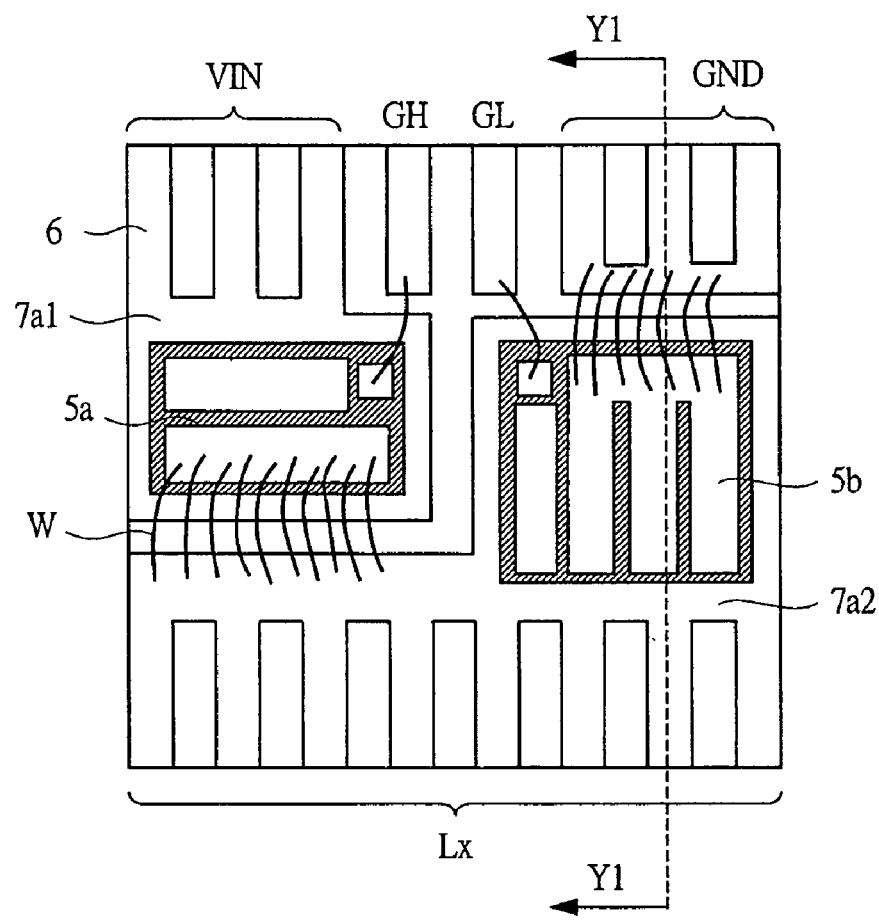
FIG. 3 is a plan view showing an inside of a package examined by the inventors of the present invention.
Figure 4:
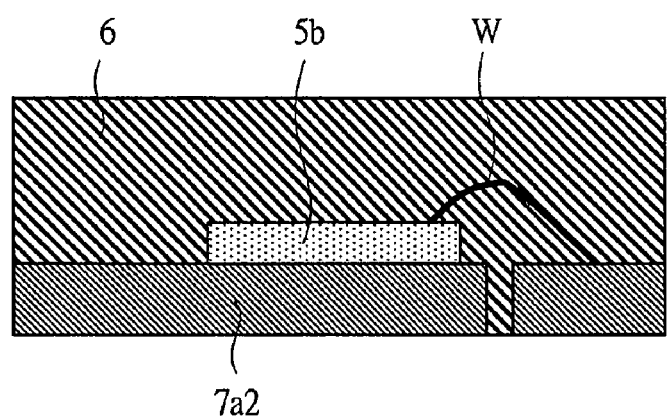
FIG. 4 is a cross sectional view taken along the line Y1-Y1 in FIG. 3.

Herein, according to the examinations by the inventors of the present invention, as an example of the package structure for reducing the parasitic inductance, the structure shown in FIG. 3 to FIG. 7 can be exemplified. FIG. 3 is a plan view showing the inside of the package, and FIG. 4 is a cross sectional view taken along the line Y1-Y1 in FIG. 3. In FIG. 3 and FIG. 4, a semiconductor chip 5a on which the power MOS QH1 for high side and a semiconductor chip 5b on which the power MOS QL1 for low side are contained in the same sealing body 6. Semiconductor chips 5a and 5b are mounted on respectively different die pads 7a1 and 7a2. The source of the power MOS QH1 for high side is electrically connected via a bonding wire (hereinafter, referred to simply as wire) W to the die pad 7a2 on which the power MOS QL1 for low side is mounted.

Figure 5:
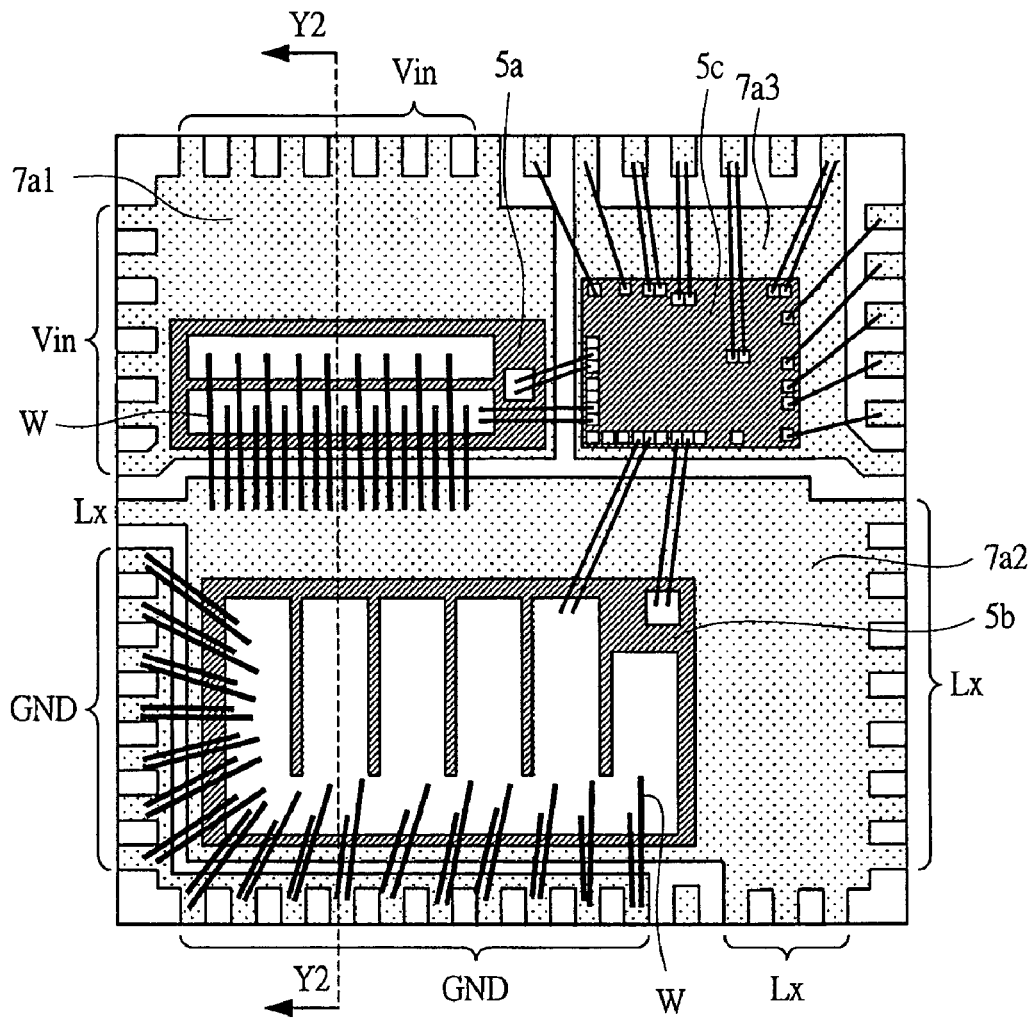
FIG. 5 is a plan view showing an inside of a package examined by the inventors of the present invention.
Figure 6:
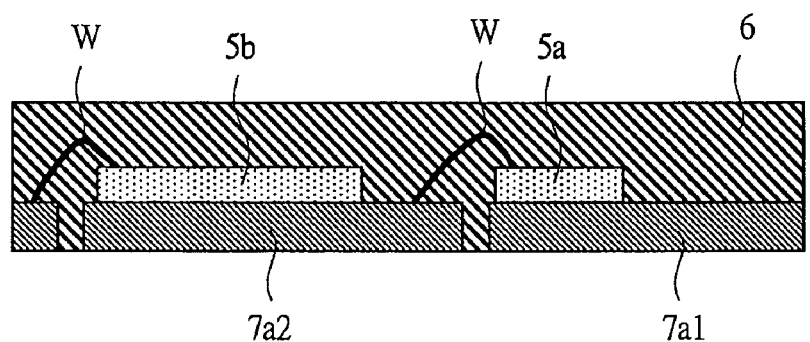
FIG. 6 is a cross sectional view taken along the Y2-Y2 in FIG. 5.

FIG. 5 is a plan view showing the inside of the package, and FIG. 6 is a cross sectional view taken along the line Y2-Y2 in FIG. 5. In FIG. 5 and FIG. 6, in addition to the above-mentioned semiconductor chips 5a and 5b, a semiconductor chip 5c on which the driver circuit 3 is formed is also contained in the same sealing body 6. The semiconductor chip 5c is mounted on a die pad 7a3 different from the die pads 7a1 and 7a2. Also in this example, the semiconductor chips 5a and 5b are mounted on respectively different die pads 7a1 and 7a2, and the source of the power MOS QH1 for high side is electrically connected via the wire W to the die pad 7a2 on which the power MOS QL1 for low side is mounted.

Figure 7:
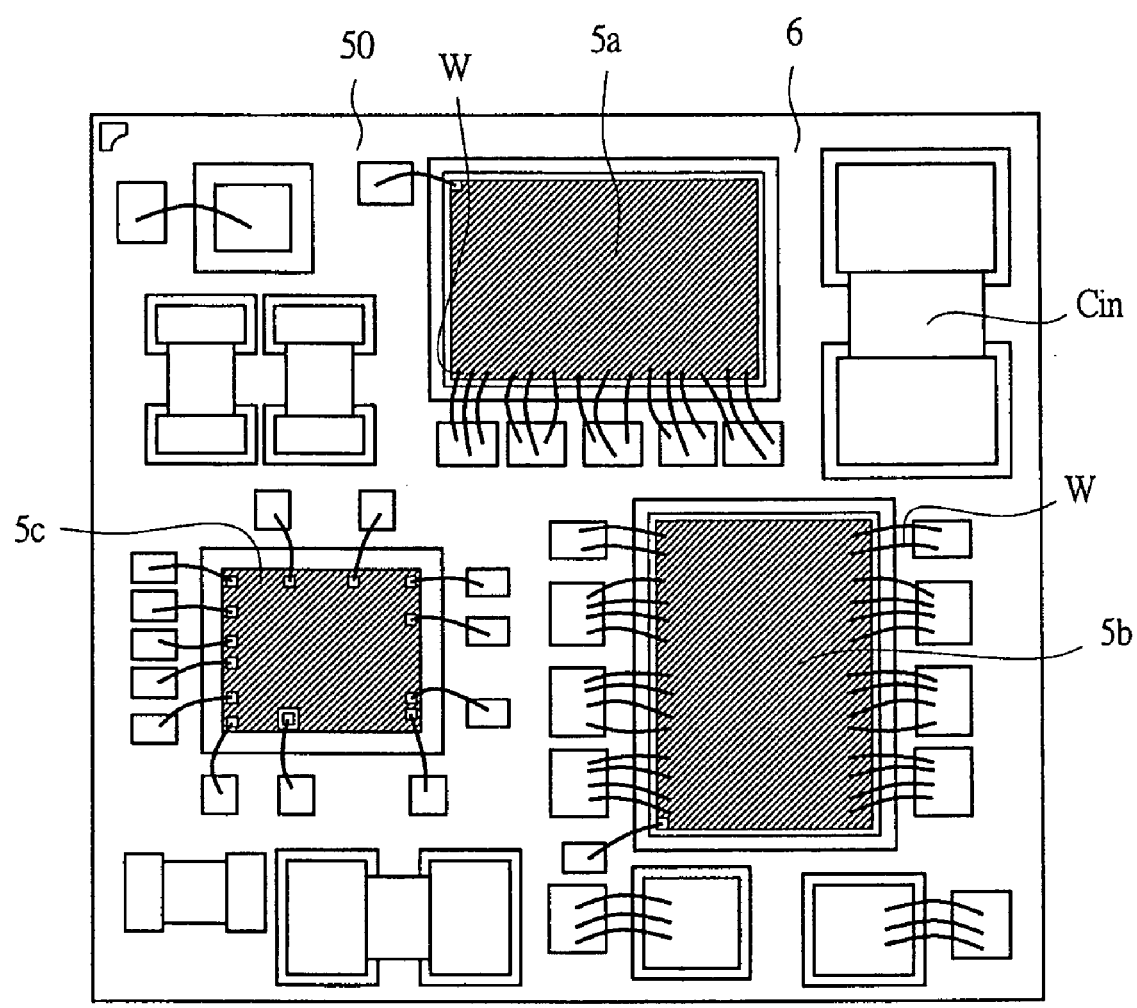
FIG. 7 is a plan view showing an inside of a package according to Patent Document 2 examined by the inventors of the present invention.

Further, FIG. 7 shows the package structure disclosed in the Patent Document 2, in which, in addition to the semiconductor chips 5a, 5b, and 5c, the input capacitor Cin is also contained in the same sealing body 6. In this case, the source of the power MOS QH1 for high side is electrically connected via the wire W to the wiring of a wiring board 50, and the wiring is electrically connected to the drain of the power MOS QL1 for low side. The source of the power MOS QL1 for low side is electrically connected via the wire W to the output wiring of the wiring board 50.

However, in the structure shown in FIG. 3 and FIG. 4 and that shown in FIG. 5 and FIG. 6, since the input capacitor Cin is externally disposed, it is not possible to reduce the parasitic inductances L1 and L6. Further, since the source of the power MOS QH1 for high side and the die pad 7a2 are electrically connected via the wire W and the source of the power MOS QL1 for low side and the reference potential GND are electrically connected via the wire W, the reduction of the parasitic inductances L3 and L5 is limited.

In addition, in the structure in which the semiconductor chips 5a, 5b, and 5c and the input capacitor Cin are contained in the same sealing body 6 as shown in FIG. 7, since they are connected via the wire W, it is not possible to reduce the parasitic inductances L3 and L5, and further, since there is a certain distance between the input capacitor Cin and the respective power MOSs QH1 and QL1, the reduction of the parasitic inductances L1 and L6 is limited.

Therefore, in the first embodiment, in order to reduce the parasitic inductances L3 and L4 of the parasitic inductances L1 to L6, the power MOS for high side and the power MOS for low side are mounted on a common die pad (tab, chip mounting portion). Therefore, in the first embodiment, the power MOS for high side of the non-insulated DC-DC converter 1 is formed of an n-channel vertical power MOS, and a flip chip structure is used to connect the source electrode thereof to a die pad.

Figure 8:
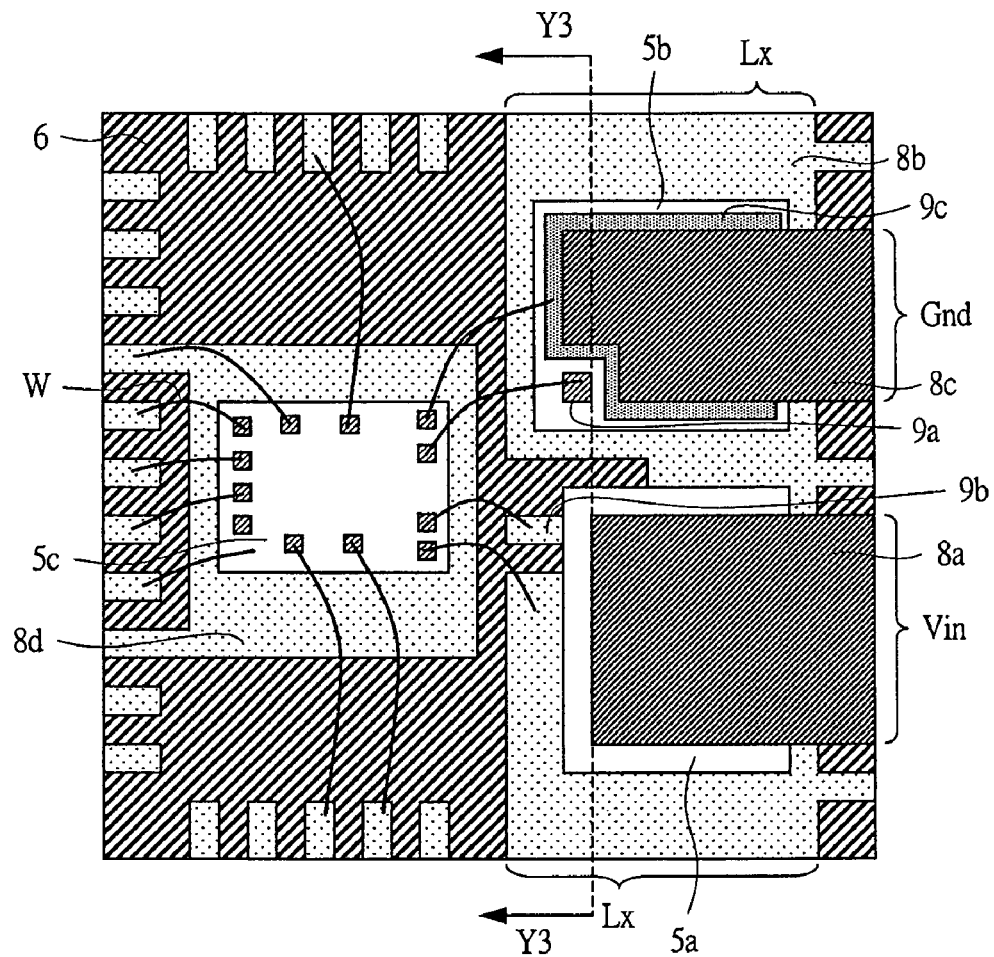
FIG. 8 is a plan view showing an inside of a package of a semiconductor device according to an embodiment of the present invention.
Figure 9:
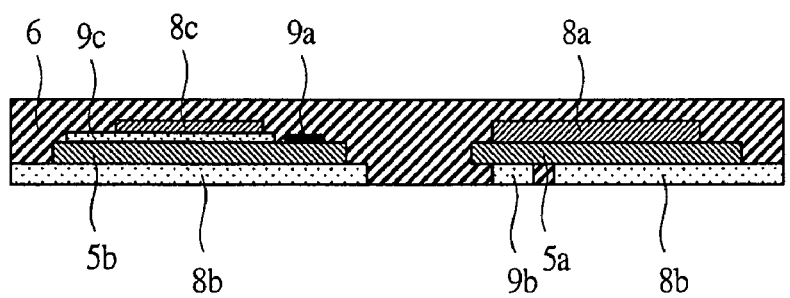
FIG. 9 is a cross sectional view taken along the line Y3-Y3 in FIG. 8.

FIG. 8 and FIG. 9 show an example of the package structure according to the first embodiment. FIG. 8 is a plan view showing the inside of the package, and FIG. 9 is a cross sectional view taken along the line Y3-Y3 in FIG. 8. In FIG. 8, the inside of the package is shown in a see-through manner for easy understanding of the structure.

Two separately-formed semiconductor chips 5a and 5b are mounted on a common die pad 8b and contained in the package. The n-channel vertical power MOS for high side of the non-insulated DC-DC converter 1 is formed on the semiconductor chip (first semiconductor chip) 5a. Further, the n-channel vertical power MOS for low side of the non-insulated DC-DC converter 1 is formed on the semiconductor chip (second semiconductor chip) 5b. A driving IC (Integrated Circuit) 5c (third semiconductor chip) for driving the gates of the first semiconductor chip and the second semiconductor chip is mounted on the die pad 8d and is connected via the wire bonding to the die pad 8b corresponding to the source electrode of the first semiconductor chip 5a and the pad 9b corresponding to the gate electrode thereof. Also, the third semiconductor chip is connected to the source electrode 9c and the gate electrode pad 9a of the second semiconductor chip via the wire bonding.

The drain electrode of the first semiconductor chip is connected via a lead plate 8a to the external terminal Vin for supplying power, and the source electrode 9c of the second semiconductor chip is connected via the lead plate 8c to the external terminal Gnd for supplying reference voltage, and the common die pad 8b is connected to the external terminal Lx for output.

As described above, in the first embodiment, since the MOS for high side and the MOS for low side are mounted on the common die pad, the parasitic inductances L3 and L4 are reduced. Further, since the lead plate is used for the connection between the drain electrode of the MOS for high side and the external terminal and the connection between the source electrode of the MOS for low side and the external terminal, the parasitic inductances L2 and L5 are reduced.

Next, the MOS for low side in FIG. 8 and the peripheral structure thereof will be described with reference to FIG. 15.

Figure 15A:
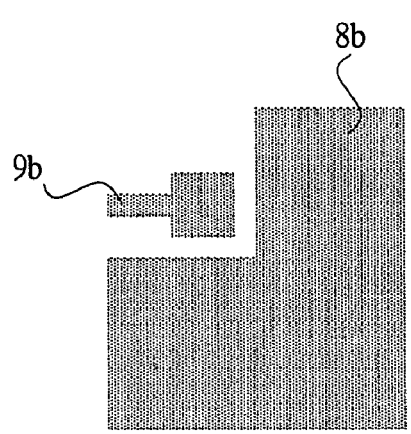
FIG. 15A is a diagram for describing the MOS for low side in FIG. 8 and peripheral structure thereof.
Figure 15B:
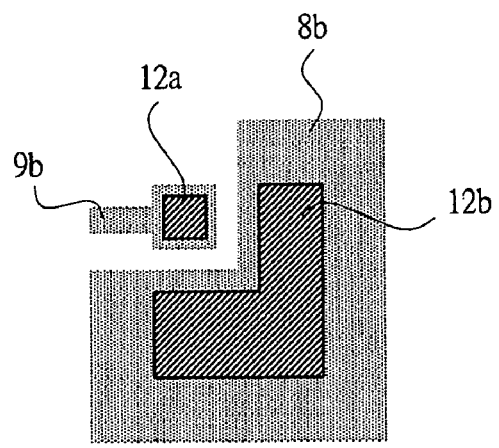
FIG. 15B is a diagram for describing the MOS for low side in FIG. 8 and peripheral structure thereof.
Figure 15C:
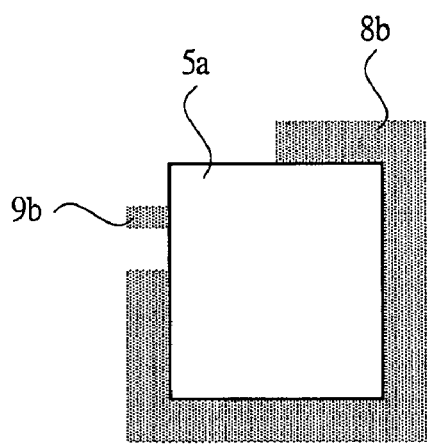
FIG. 15C is a diagram for describing the MOS for low side in FIG. 8 and peripheral structure thereof.
Figure 15D:
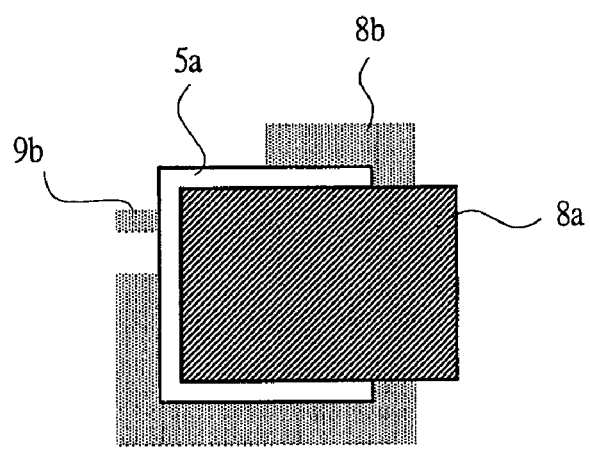
FIG. 15D is a diagram for describing the MOS for low side in FIG. 8 and peripheral structure thereof.

FIG. 15A shows a pattern of the lead frame, in which the bonding pad (high side) 9b for the gate and the lead plate 8b for the source are shown. In FIG. 15B, 12a and 12b denote structures in an upper layer than the lead frame of FIG. 15A, that is, a gate pad 12a and a source pad 12b. FIG. 15C shows a structure in an upper layer than the gate pad 12a and the source pad 12b in FIG. 15B, in which the semiconductor chip (power MOS for low side) 5a is shown. Further, FIG. 15D shows a structure in an upper layer than the semiconductor chip 5a in FIG. 15C, in which the lead plate (power source voltage) 8a is shown.

Second Embodiment

As described above, by the structure according to the first embodiment, it is possible to reduce the inductances L2, L3, L4, and L5 of the wirings shown in FIG. 1. However, in the first embodiment, it is not possible to reduce the parasitic inductance L1 which occurs between the plus terminal of the input capacitor Cin and the drain terminal of the power MOS for high side and the parasitic inductance L6 which occurs between the minus terminal of the input capacitor Cin and the source terminal of the power MOS for low side. The second embodiment has been made in consideration of this, and it enables to reduce the inductances L1 and L6.

Figure 10:
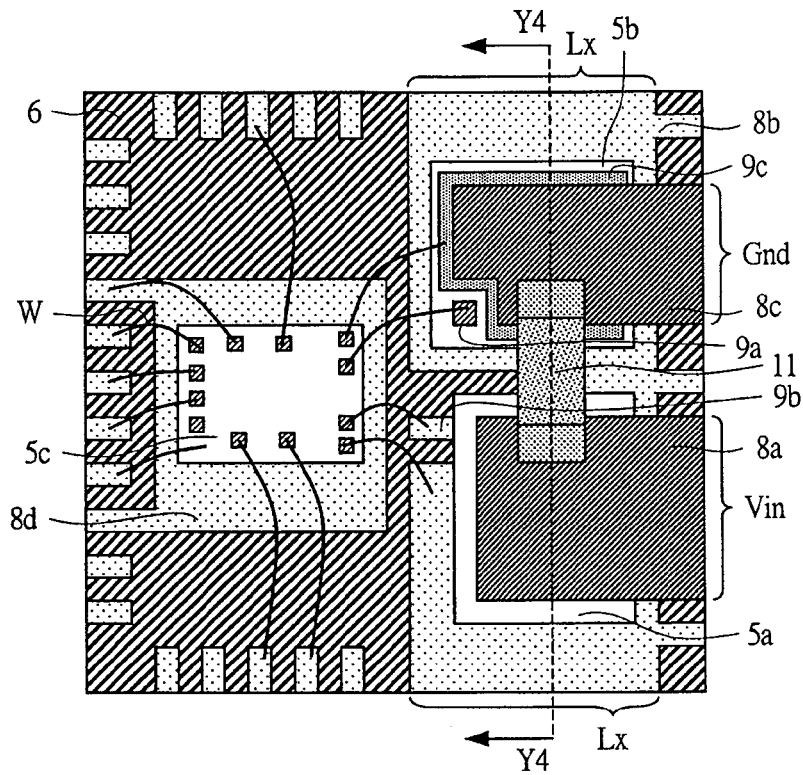
FIG. 10 is a plan view showing an inside of a package of a semiconductor device according to an embodiment of the present invention.
Figure 11:
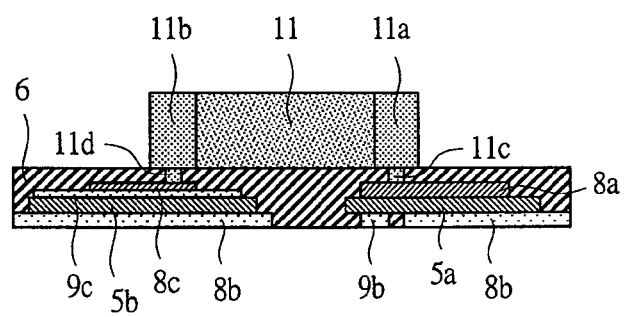
FIG. 11 is a cross sectional view taken along the line Y4-Y4 in FIG. 10.

FIG. 10 and FIG. 11 show an example of the package structure according to the second embodiment. FIG. 10 is a plan view showing the inside of the package, and FIG. 11 is a cross sectional view taken along the line Y4-Y4 in FIG. 10. In FIG. 10, the inside of the package is shown in a see-through manner for easy understanding of the structure.

The point where the second embodiment is different from the first embodiment is that an input capacitor 11 is mounted on a surface of the package. A plus electrode 11a of the input capacitor 11 is connected via a conductive component 11c to the lead plate 8a that is electrically connected to the external terminal for supplying input power, and a minus electrode 11b of the input capacitor 11 is connected via a conductive component lid to the lead plate 8b that is electrically connected to the external terminal for supplying reference potential.

Figure 13:
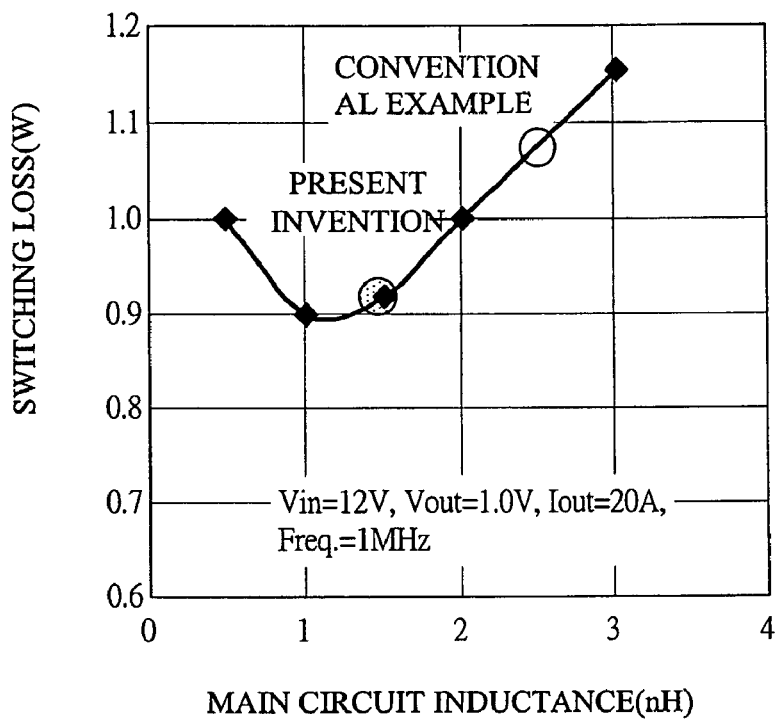
FIG. 13 is a graph showing the relation between main circuit inductance and switching loss for describing the effect of the present invention.

Next, the effect of the present embodiment will be described with reference to FIG. 13 and FIG. 14. FIG. 13 shows the wiring inductance of the main circuit in the horizontal axis and the switching loss of the power MOS for high side (first semiconductor) in the vertical axis. The wiring inductance of the main circuit is equivalent to the total value of L1 to L6 in FIG. 1. As the main circuit inductance decreases, the switching loss lowers, but when the main circuit inductance reaches 1 nH or less, the switching loss increases. The conventional example is the measurement result of the case using the package in FIG. 5. Since the inductance of the present embodiment is smaller than that of the conventional example, it can be understood that the switching loss can be decreased. When the switching loss is small, it is possible to eliminate cooling parts such as a heat sink and the like, which makes it possible to reduce the size of a power source. In addition, under the conditions that the loss is fixed, the switching frequency can be improved in the present embodiment. Therefore, it is possible to reduce the size of an output filter consisting of an inductor and a capacitor.

Figure 14:
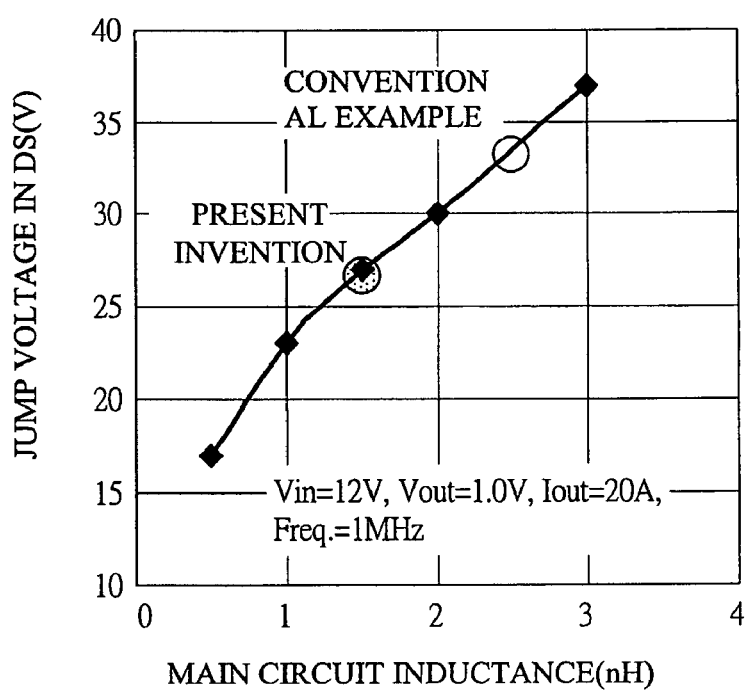
FIG. 14 is a graph showing the relation between main circuit inductance and jump voltage for describing the effect of the present invention.

FIG. 14 shows the wiring inductance of the main circuit in the horizontal axis and jump voltage between the source and the drain of the MOS for high side at the time of switching in the vertical axis. As the main circuit inductance is smaller, the jump voltage becomes smaller. The conventional example is the measurement result of the case using the package in FIG. 5. Since the inductance of the present embodiment is smaller than that of the conventional example, the jump voltage decreases. When the jump voltage is low, conduction noise and radiation noise become small, and therefore, it is possible to prevent the malfunction of other semiconductor devices and electronic devices.

Third Embodiment

As described above, by the structure according to the second embodiment, it is possible to reduce the inductances L1 to L6 of the wirings shown in FIG. 1. However, in the second embodiment, since the capacitor is mounted on the package surface, there is a problem that the heat resistance of the surface is high. The third embodiment has been made in consideration of this, and it enables to reduce the heat resistance of the surface.

Figure 12:
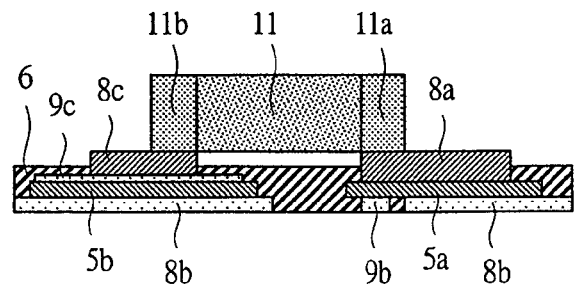
FIG. 12 is a cross sectional view of a semiconductor device according to an embodiment of the present invention.

FIG. 12 is a diagram for describing the third embodiment, and the point different from FIG. 11 is that the lead plates 8a and 8b are exposed on the package surface. The plus electrode 11a of the input capacitor 11 is connected to the lead plate 8a that is electrically connected to the external terminal for supplying input power, and the minus electrode 11b of the input capacitor 11 is connected to the lead plate 8b that is electrically connected to the external terminal for supplying reference potential.

In the above descriptions, the cases where the invention made by the inventors of the present invention is applied to the power source unit of a CPU and a DSP which is the background thereof have been described. However, the application of the present invention is not limited to this, and the present invention can be applied to various devices. For example, it may be applied to a power source unit of other circuit.

The present invention can be applied to a semiconductor device and an electronic device.

What is claimed is:

1. A semiconductor device comprising:
    a conductive first chip mounting portion having a first main surface and a second main surface on an opposite side thereof;
    a first external terminal for supplying input power disposed near the first chip mounting portion;
    a second external terminal for supplying a reference potential disposed near the first chip mounting portion;
    a third external terminal integrally formed with the first chip mounting portion for providing an output;
    a first semiconductor chip mounted on the first main surface of the first chip mounting portion;
    a second semiconductor chip mounted on the first main surface of the first chip mounting portion;
    a first plate conductive component which electrically connects an electrode of the second semiconductor chip to the second external terminal;
    a second plate conductive component which electrically connects an electrode of the first semiconductor chip to the first external terminal;
    a second chip mounting portion having a first main surface and a second main surface on an opposite side thereof;
    a third semiconductor chip mounted on the first main surface of the second chip mounting portion;
    an n-channel vertical field effect transistor formed on the first semiconductor chip and the second semiconductor chip;
    a bonding wire which connects source electrode pads and gate electrode pads of the third semiconductor chip and the first semiconductor chip;
    a bonding wire which connects source electrodes and gate electrodes of the third semiconductor chip and the second semiconductor chip; and
    a sealing body which seals the first semiconductor chip, the second semiconductor chip, the third semiconductor chip, the first plate conductive component, the second plate conductive component, and the bonding wires,
    wherein the source electrode of the first semiconductor chip and a drain electrode of the second semiconductor chip are electrically connected to the first chip mounting portion, and
    wherein one electrode of a capacitor is electrically connected via a first connection layer to the first plate conductive component, and the other electrode of the capacitor is electrically connected via a second connection layer to the second plate conductive component.

2. A power source unit of a synchronous rectification type, in which a DC input power source and one main terminal of a rectification MOSFET are connected to a positive potential side of the DC input power source, the other main terminal is connected to one main terminal of a choke coil and one main terminal of a commutation MOSFET, the other main terminal of the commutation MOSFET is connected to a negative potential side of the DC input power source, one terminal of an output capacitor is connected to the other terminal of the choke coil, the other terminal of the output capacitor is connected to the other main terminal of the commutation MOSFET, one terminal which supplies electric power to a semiconductor device to be a load is connected to the other terminal of the choke coil, the other terminal which supplies electric power to the semiconductor device to be a load is connected to the other main terminal of the commutation MOSFET, and gates of the rectification MOSFET and the commutation MOSFET are driven by a control circuit, wherein the power source unit is coupled to the semiconductor device of claim 1 as follows:

the positive potential side of the DC input power source is coupled to the first external terminal of the semiconductor device, the negative potential side of the DC input power source is coupled to the second external terminal of the semiconductor device, and the choke coil is coupled to the third external terminal of the semiconductor device.

\* \* \* \* \*